United States Patent
Shi

(10) Patent No.: US 10,848,299 B2
(45) Date of Patent: Nov. 24, 2020

(54) PHASE INTERPOLATOR

(71) Applicant: Amlogic (Shanghai) Co., Ltd., Shanghai (CN)

(72) Inventor: Ming Shi, Shanghai (CN)

(73) Assignee: AMLOGIC (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/728,487

(22) Filed: Dec. 27, 2019

(65) Prior Publication Data

US 2020/0213077 A1   Jul. 2, 2020

(30) Foreign Application Priority Data

Dec. 29, 2018 (CN) .......................... 2018 1 1642621

(51) Int. Cl.
*H04L 7/00* (2006.01)
*H04L 7/033* (2006.01)

(52) U.S. Cl.
CPC .......... *H04L 7/0337* (2013.01); *H04L 7/0025* (2013.01)

(58) Field of Classification Search
CPC ..... H04L 7/0025; H04L 7/0029; H04L 27/20; H04L 7/0337
USPC ................. 375/302, 355, 362, 371, 374–376
See application file for complete search history.

(56) References Cited

U.S. PATENT DOCUMENTS

| | | | | |
|---|---|---|---|---|
| 2011/0001527 A1* | 1/2011 | Lee | ...................... | H03K 5/1565 327/158 |
| 2011/0050312 A1* | 3/2011 | Fujino | .................. | H03K 5/1565 327/237 |
| 2011/0068827 A1* | 3/2011 | Ali | ......................... | H03D 13/00 327/3 |
| 2011/0241746 A1* | 10/2011 | Fu | ........................ | H03H 11/265 327/276 |
| 2012/0139591 A1* | 6/2012 | Ozeki | ...................... | H03K 5/13 327/148 |
| 2014/0002173 A1* | 1/2014 | Park | ....................... | H03K 5/131 327/356 |
| 2014/0037035 A1* | 2/2014 | Chung | ................... | H03H 11/20 375/373 |

(Continued)

FOREIGN PATENT DOCUMENTS

CN   104135251 B   4/2017
CN   108923773 A   11/2018

*Primary Examiner* — Emmanuel Bayard
(74) *Attorney, Agent, or Firm* — Panitch Schwarze Belisario & Nadel LLP

(57) ABSTRACT

A phase interpolator includes a phase adjusting circuit. The phase adjusting circuit includes a first phase adjusting module and a second phase adjusting module, the first phase adjusting module outputs a first clock signal, and the second phase adjusting module outputs a second clock signal; the first phase adjustment module and the second phase adjustment module are connected in parallel to output an interpolation signal. Through the first phase adjustment module and the second phase adjustment module the first clock signal and the second clock signal with the same frequency and different phases are mixed in proportion by adopting a voltage mode to generate an interpolation so as to achieve the purpose of phase adjustment, and meanwhile, the circuit can be carried out under lower voltage, so that the power consumption of the phase adjusting circuit is further reduced.

16 Claims, 3 Drawing Sheets

(56) References Cited

U.S. PATENT DOCUMENTS

| | | | | |
|---|---|---|---|---|
| 2014/0125394 A1* | 5/2014 | Hood | ............... | H03K 5/13 |
| | | | | 327/237 |
| 2014/0321515 A1* | 10/2014 | Ponton | ............... | H03D 3/00 |
| | | | | 375/219 |
| 2014/0321577 A1* | 10/2014 | Kuttner | ............... | H04L 27/20 |
| | | | | 375/302 |

* cited by examiner

PHASE INTERPOLATOR

CROSS-REFERENCE TO RELATED APPLICATIONS

The present application claims priority to and the benefit of Chinese Patent Application No. CN 201811642621.4 filed on Dec. 29, 2018, the entire content of which is incorporated herein by reference.

BACKGROUND OF THE INVENTION

1. Field of the Invention

The invention relates to the technical field of high-speed data transmission, and more particularly, to a phase interpolator.

2. Description of the Related Art

The phase interpolator is a device for adjusting the phase of a circuit clock and has been widely used in the related field. The phase interpolator is a device capable of mixing two input periodic clocks with the same frequency and different phases in proportion to generate an output clock signal with the same frequency and the phase between the two input periodic clocks. In practice, a requirement will be imposed that gears of the phase interpolator need to be switched.

In the prior art, the conventional phase interpolator is a current steering phase interpolator. A clock at the middle phase of the two IQ clocks is obtained by selecting different current weights of two adjacent IQ clocks signals in the circuit, as shown in FIG. 1. In a phase diagram representing the conventional phase interpolator shown in FIG. 2, a1 and a2 refer to weights of two input phases, wherein ideal weighting factors a1 and a2 are indicated by dashed lines, and conventional weighting factors a1 and a2 are indicated by solid lines. FIG. 3 shows a relationship between the weighting factors a1 and a2 of the conventional phase interpolator and the phase angle φ. When the above-mentioned circuit is applied to a high-speed circuit, due to the fact that all of the circuits are driven by current, larger current is needed for the fast switch of signals at a high speed; in the meantime, only when an input signal is preferably a sinusoidal signal can a better result be obtained, and the cost is relatively high.

SUMMARY OF THE INVENTION

Given that the foregoing problems exist in the prior art, the present invention provides a phase interpolator.

The technical solution is as follows:

A phase interpolator, comprising:

a phase adjusting circuit comprising a first phase adjusting module and a second phase adjusting module, the first phase adjusting module outputting a first clock signal, and the second phase adjusting module outputting a second clock signal;

the first phase adjusting module and the second phase adjusting module are connected in parallel to output an interpolation signal.

Preferably, wherein the phase interpolator further comprises a low-pass filter circuit, an input end of the low-pass filter circuit is connected to an output end of the phase adjusting circuit, the low-pass filter circuit is configured to filter a high-frequency signal of the interpolation signal.

Preferably, wherein the phase interpolator further comprises a shaping circuit, an input end of the shaping circuit is connected to an output end of the low-pass filter circuit, the shaping circuit is configured to shape the interpolation signal output by the low-pass filter circuit, so as to output a required interpolation signal.

Preferably, wherein each of the first phase adjusting module and the second phase adjusting module comprises:

a signal input end;

a signal output end;

a first MOS transistor, wherein a gate of the first MOS transistor is connected to the signal input end, a drain of the first MOS transistor is connected to a VCC (Volt Current Condenser), and a source of the first MOS transistor is connected to a first fulcrum;

a first adjusting module, connected between the first fulcrum and the signal output end;

a second MOS transistor, wherein a gate of the second MOS transistor is connected to the signal input end, a source of the second MOS transistor is connected to a ground (GND), and a drain of the second MOS transistor is connected to a second fulcrum; and a second adjusting module, connected between the second fulcrum and the signal output end.

Preferably, the first adjusting module comprises a plurality of first adjusting circuits, each of which is connected between the first fulcrum and the signal output end.

Preferably, each of the plurality of first adjusting circuits comprises:

a first switch tube, wherein a drain of the first switch tube is connected to the first fulcrum; and a first resistor, connected between a source of the first switch tube and the signal output end.

Preferably, the second adjusting module comprises a plurality of second adjusting circuits, each of which is connected between the second fulcrum and the signal output end.

Preferably, each of the plurality of second adjusting circuits comprises:

a second switch tube, wherein a source of the second switch tube is connected to the second fulcrum; and a second resistor, connected between a drain of the second switch tube and the signal output end.

Preferably, both the first MOS transistor and the first switch tube are N-type MOS transistors.

Preferably, both the second MOS transistor and the second switch tube are P-type MOS transistors.

Preferably, each of the first phase adjusting module and the second phase adjusting module comprises:

a signal input end;

a signal output end;

a third MOS transistor, wherein a gate of the third MOS transistor is connected to the signal input end, a drain of the third MOS transistor is connected to a third fulcrum, and a source of the third MOS transistor is connected to the signal output end;

a third adjusting module, connected between the third fulcrum and a VCC;

a fourth MOS transistor, wherein a gate of the fourth MOS transistor is connected to the signal input end, a source of the fourth MOS transistor is connected to a fourth fulcrum, and a drain of the fourth MOS transistor is connected to the signal output end; and a fourth adjusting module, connected between the fourth fulcrum and the ground.

Preferably, the third adjusting module comprises a plurality of third adjusting circuits, each of which is connected between the third fulcrum and the VCC.

Preferably, each of the plurality of third adjusting circuits comprises:

a third switch tube, wherein a drain of the third switch tube is connected to the VCC; and a third resistor, connected between a source of the third switch tube and the third fulcrum.

Preferably, the fourth adjusting module comprises a plurality of fourth adjusting circuits, each of which is connected between the fourth fulcrum and the ground.

Preferably, each of the plurality of fourth adjusting circuits comprises:

a fourth switch tube, wherein a source of the fourth switch tube is connected to the ground; and a fourth resistor, connected between a drain of the fourth switch tube and the fourth fulcrum.

Preferably, both the third MOS transistor and the third switch tube are N-type MOS transistors.

Preferably, both the fourth MOS transistor and the fourth switch tube are P-type MOS transistors.

By adopting the above-mentioned technical solutions, the present invention has the beneficial effects that a phase interpolator is disclosed, by using a first phase adjustment module and a second phase adjustment module, a first clock signal and a second clock signal with the same frequency and different phases are mixed in proportion by adopting a voltage mode to generate an interpolation signal with the same frequency and the phase between the first clock signal and the second clock signal so as to achieve the purpose of phase adjustment, and meanwhile, the circuit can be carried out under lower voltage, so that the power consumption of the phase adjusting circuit is further reduced.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
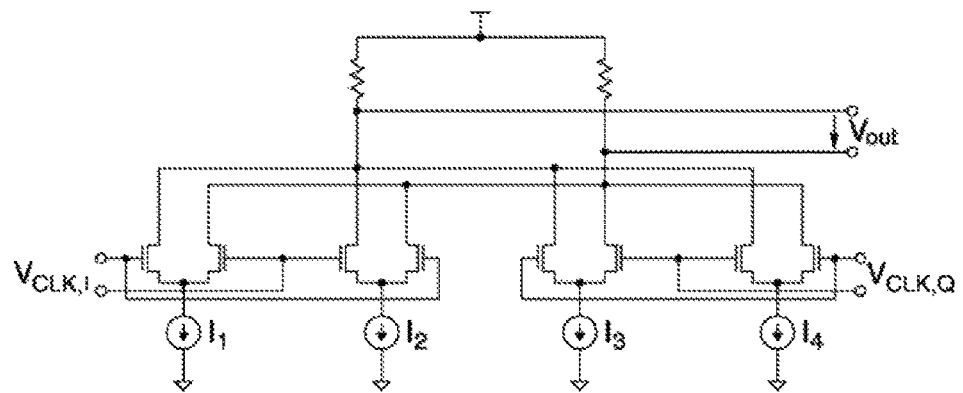
FIG. 1 shows a circuit diagram of a phase interpolator in the prior art.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

Figure 2:
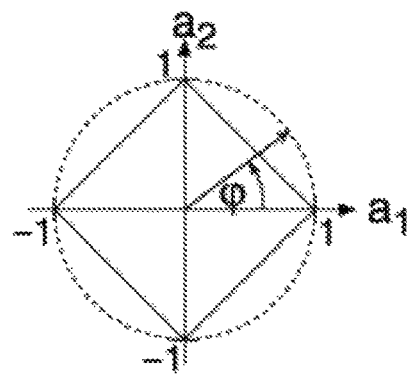
FIG. 2 shows a phase diagram of the phase interpolator in the prior art.
Figure 3:
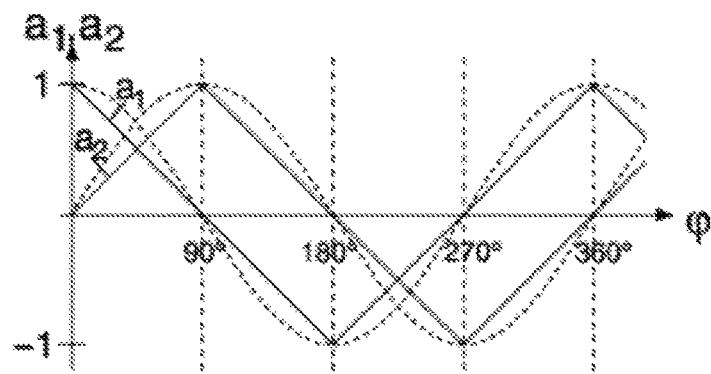
FIG. 3 shows a waveform graph of the phase interpolator in the prior art.

In the prior art, the conventional phase interpolator is a current steering phase interpolator. A clock at the middle phase of the two IQ clocks is obtained by selecting different current weights of two adjacent IQ clocks signals in the circuit, as shown in FIG. 1. As shown in FIGS. 2 and 3, when the above-mentioned circuit is applied to a high-speed circuit, due to the fact that all of the circuits are driven by current, larger current is needed for the fast switch of signals at a high speed; in the meantime, only when an input signal is preferably a sinusoidal signal can a better result be obtained, and the cost is relatively high.

Figure 4:
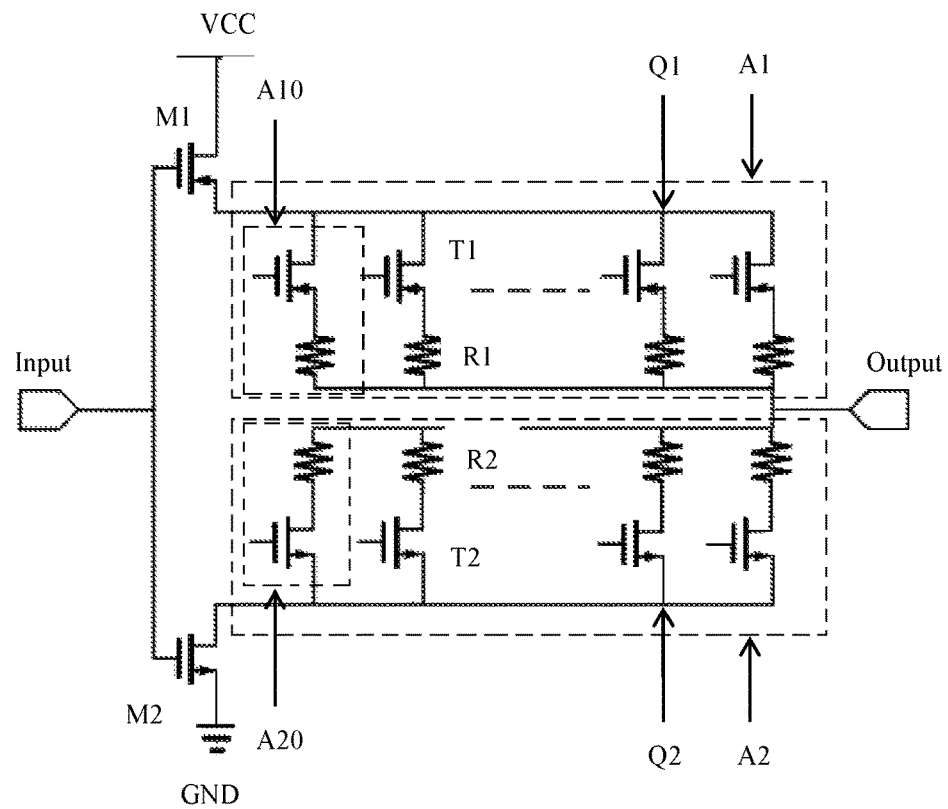
FIG. 4 shows a circuit diagram of a phase adjusting module according to an embodiment of the present invention.
Figure 5:
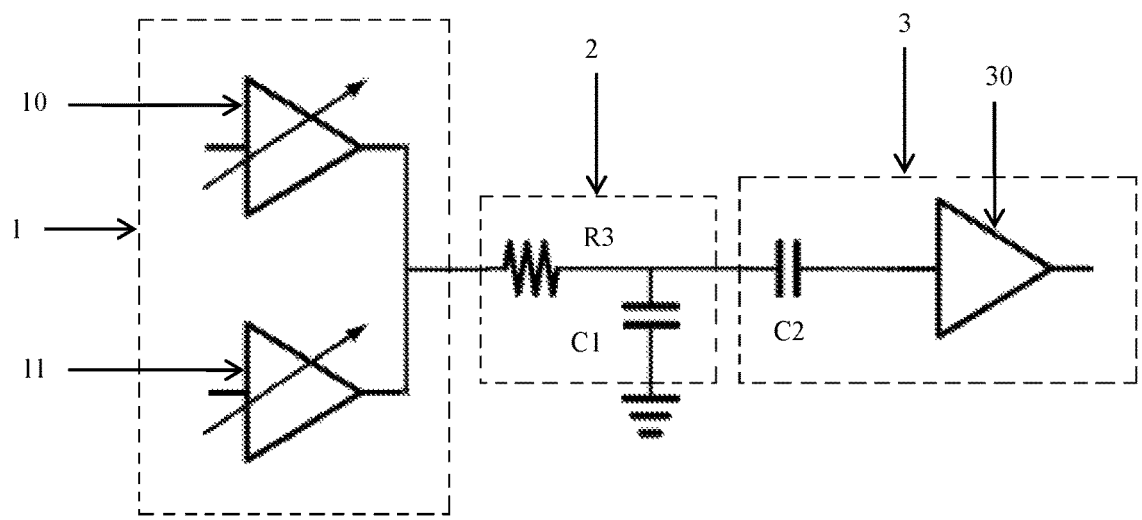
FIG. 5 shows a circuit diagram of a phase interpolator according to an embodiment of the present invention.

Given that the foregoing problems exist in the prior art, the present invention provides a phase interpolator. With reference to FIGS. 4 and 5, the phase interpolator comprises:

a phase adjusting circuit 1 comprising a first phase adjusting module 10 and a second phase adjusting module 11, the first phase adjusting module 10 outputting a first clock signal, and the second phase adjusting module 11 outputting a second clock signal;

the first phase adjusting module 10 and the second phase adjusting module 11 are connected in parallel to output an interpolation signal.

By adopting the above-mentioned technical solution, a phase interpolator is disclosed, comprising a phase adjusting circuit 1. The phase adjusting circuit 1 consists of a first phase adjusting module 10 and a second phase adjusting module 12. By using the first phase adjustment module 10 and the second phase adjustment module 11, a first clock signal and a second clock signal with the same frequency and different phases are mixed in proportion by adopting a voltage mode to generate an interpolation signal with the same frequency and the phase between the first clock signal and the second clock signal so as to achieve the purpose of phase adjustment, and meanwhile, the circuit can be carried out under lower voltage, so that the power consumption of the phase adjusting circuit is further reduced.

In a preferred embodiment, the phase interpolator further comprises a low-pass filter circuit 2, an input end of the low-pass filter circuit 2 is connected to an output end of the phase adjusting circuit 1, the low-pass filter circuit 2 is configured to filter a high-frequency signal of the interpolation signal; and the phase interpolator further comprises a shaping circuit 3, an input end of the shaping circuit 3 is connected to an output end of the low-pass filter circuit 2, the shaping circuit 3 is configured to shape the interpolation signal output by the low-pass filter circuit 2, so as to output a required interpolation signal.

In particular, as shown in FIG. 5, by using a first phase adjustment module 10 and a second phase adjustment module 10, a first clock signal and a second clock signal with the same frequency and different phases are mixed in proportion by adopting a voltage mode to generate an interpolation signal with the same frequency and the phase between the first clock signal and the second clock signal. Filter, by the low-pass filter circuit 2, a high-frequency signal of the interpolation signal. The low-pass filter circuit 2 may consist of a first capacitor C1 and a third resistor R3, wherein the third resistor R3 is connected to the output end of the phase adjusting circuit 1, and the first capacitor C1 is connected between the third resistor R3 and the ground GND. Shape, by the shaping circuit 3, the interpolation signal output by the low-pass filter circuit 2, so as to output a required interpolation signal. The shaping circuit 3 may consist of a second capacitor C2 and a shaping circuit 30, wherein the second capacitor C2 is connected in series with the shaping circuit 30, and is connected between the third resistor R3 and the output end of the phase adjusting circuit 1. In this way, phase adjustment is achieved, and meanwhile, the circuit can be carried out under lower voltage, so that the power consumption of the phase adjusting circuit is further reduced.

In a preferred embodiment, each of the first phase adjusting module 10 and the second phase adjusting module 11 comprises:

a signal input end;

a signal output end;

a first MOS transistor M1, wherein a gate of the first MOS transistor M1 is connected to the signal input end, a drain of the first MOS transistor M1 is connected to Volt Current Condenser (VCC), and a source of the first MOS transistor M1 is connected to a first fulcrum Q1;

a first adjusting module A1, connected between the first fulcrum Q1 and the signal output end Output;

a second MOS transistor M2, wherein a gate of the second MOS transistor M2 is connected to the signal input end Input, a source of the second MOS transistor M2 is connected to a ground (GND), and a drain of the second MOS transistor M2 is connected to a second fulcrum Q2; and a second adjusting module A2, connected between the second fulcrum Q2 and the signal output end Output.

In particular, as shown in FIG. 4, circuit diagrams of the first phase adjusting module 10 and the second phase adjusting module 11 are symmetrically distributed. The circuit diagrams comprise the signal input end Input, the signal output end Output, the first MOS transistor M1, the first adjusting module A1, the second MOS transistor M2, the second adjusting module A2, wherein the first MOS transistor M1 is a N-type MOS transistor, and the second MOS transistor M2 is a P-type MOS transistor.

Furthermore, by adjusting the first adjusting module A1 and the second adjusting module A2, a first clock signal and a second clock signal with the same frequency and different phases are mixed in proportion by adopting a voltage mode to generate an interpolation signal with the same frequency and the phase between the first clock signal and the second clock signal so as to achieve the purpose of phase adjustment, and meanwhile, the circuit can be carried out under lower voltage, so that the power consumption of the phase adjusting circuit is further reduced.

In a preferred embodiment, the first adjusting module A1 comprises a plurality of first adjusting circuits A10, each of which is connected between the first fulcrum Q1 and the signal output end Output;

each of the plurality of first adjusting circuits A10 comprises:

a first switch tube T1, wherein a drain of the first switch tube T1 is connected to the first fulcrum Q1; and a first resistor R1, connected between a source of the first switch tube T1 and the signal output end Output.

In particular, as shown in FIG. 4, the first adjusting module A1 comprises a plurality of first adjusting circuits A10, and each of the plurality of first adjusting circuits A10 comprises the first switch tube T1 and the first resistor R1, the first switch tube T1 is a N-type MOS transistor. Voltage weights of the first adjusting module A1 can be adjusted by selecting different resistance values of the first resistor R1 through the first switch tube T1, so as to achieve the purpose of phase adjustment.

Furthermore, by adjusting the first switch tube T1 of the first adjusting module A1, and selecting different resistance values of the first resistor R1, a first clock signal and a second clock signal with the same frequency and different phases are mixed in proportion by adopting a voltage mode to generate an interpolation signal with the same frequency and the phase between the first clock signal and the second clock signal so as to achieve the purpose of phase adjustment, and meanwhile, the circuit can be carried out under lower voltage, so that the power consumption of the phase adjusting circuit is further reduced.

In a preferred embodiment, the second adjusting module A2 comprises a plurality of second adjusting circuits A20, each of which is connected between the second fulcrum Q2 and the signal output end Output;

each of the plurality of second adjusting circuits A2 comprises:

a second switch tube T2, wherein a source of the second switch tube T2 is connected to the second fulcrum Q2; and a second resistor R2, connected between a drain of the second switch tube T2 and the signal output end Output.

In particular, as shown in FIG. 4, the second adjusting module A2 comprises a plurality of second adjusting circuits A20, and each of the plurality of second adjusting circuits A20 comprises the second switch tube T2 and the second resistor R2, and the second switch tube T2 is a P-type MOS transistor. Voltage weights of the second adjusting module A2 can be adjusted by selecting different resistance values of the second resistor R2 through the second switch tube T2, so as to achieve the purpose of phase adjustment.

Furthermore, by adjusting the second switch tube T2 of the second adjusting module A2, and selecting different resistance values of the second resistor R2, a first clock signal and a second clock signal with the same frequency and different phases are mixed in proportion by adopting a voltage mode to generate an interpolation signal with the same frequency and the phase between the first clock signal and the second clock signal so as to achieve the purpose of phase adjustment, and meanwhile, the circuit can be carried out under lower voltage, so that the power consumption of the phase adjusting circuit is further reduced.

Figure 6:
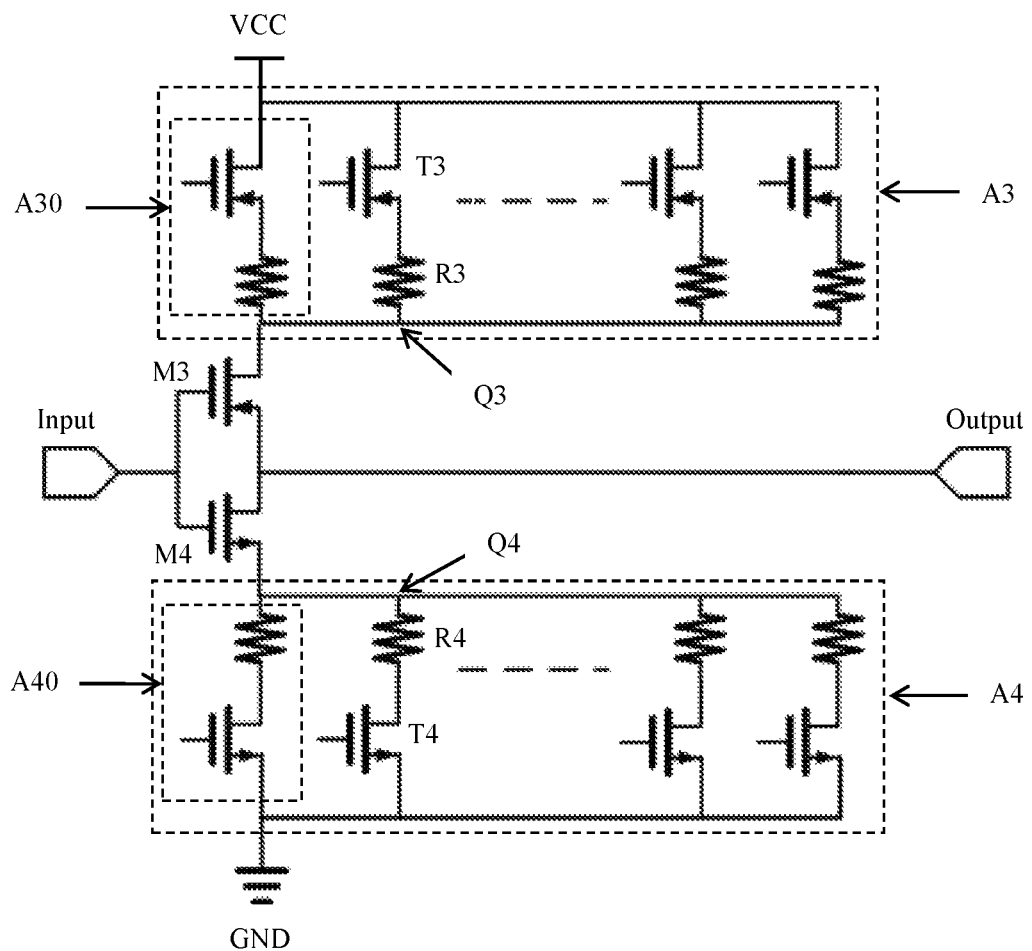
FIG. 6 shows a circuit diagram of another phase adjusting module according to an embodiment of the present invention.

Furthermore, in a further preferred embodiment, as shown in FIG. 6, each of the first phase adjusting module 10 and the second phase adjusting module 11 comprises:

a signal input end;

a signal output end;

a third MOS transistor M3, wherein a gate of the third MOS transistor M3 is connected to the signal input end Input, a drain of the third MOS transistor M3 is connected to a third fulcrum Q3, and a source of the third MOS transistor M3 is connected to the signal output end Output;

a third adjusting module A3, connected between the third fulcrum Q3 and VCC;

a fourth MOS transistor M4, wherein a gate of the fourth MOS transistor M4 is connected to the signal input end Input, a source of the fourth MOS transistor M4 is connected to a fourth fulcrum Q4, and a drain of the fourth MOS transistor M4 is connected to the signal output end Output; and a fourth adjusting module A4, connected between the fourth fulcrum Q4 and the ground (GND).

In the above-mentioned technical solution, as shown in FIG. 6, circuit diagrams of the first phase adjusting module 10 and the second phase adjusting module 11 are symmetrically distributed. The circuit diagrams comprise the signal input end Input, the signal output end Output, the third MOS transistor M3, the third adjusting module A3, the fourth MOS transistor M4, the fourth adjusting module A4, wherein the third MOS transistor M3 is a N-type MOS transistor, and the fourth MOS transistor M4 is a P-type MOS transistor.

Furthermore, by adjusting the third adjusting module A3 and the fourth adjusting module A4, a first clock signal and a second clock signal with the same frequency and different phases are mixed in proportion by adopting a voltage mode to generate an interpolation signal with the same frequency and the phase between the first clock signal and the second clock signal so as to achieve the purpose of phase adjustment, and meanwhile, the circuit can be carried out under lower voltage, so that the power consumption of the phase adjusting circuit is further reduced.

In particular, as shown in FIG. 6, the third adjusting module A3 comprises a plurality of third adjusting circuits A30, each of which is connected between the third fulcrum Q3 and VCC;

each of the plurality of third adjusting circuits A30 comprises:

a third switch tube T3, wherein a drain of the third switch tube T3 is connected to VCC; and a third resistor R3, connected between a source of the third switch tube T3 and the third fulcrum Q3.

In particular, as shown in FIG. 6, the third adjusting module A3 comprises a plurality of third adjusting circuits A30, and each of the plurality of third adjusting circuits A30 comprises the third switch tube T3 and the third resistor R3, and the third switch tube T3 is a N-type MOS transistor. Voltage weights of the third adjusting module A3 can be adjusted by selecting different resistance values of the third resistor R3 through the third switch tube T3, so as to achieve the purpose of phase adjustment.

Furthermore, by adjusting the third switch tube T3 of the third adjusting module A3, and selecting different resistance values of the third resistor R3, a first clock signal and a second clock signal with the same frequency and different phases are mixed in proportion by adopting a voltage mode to generate an interpolation signal with the same frequency and the phase between the first clock signal and the second clock signal so as to achieve the purpose of phase adjustment, and meanwhile, the circuit can be carried out under lower voltage, so that the power consumption of the phase adjusting circuit is further reduced.

In particular, as shown in FIG. 6, the fourth adjusting module A4 comprises a plurality of fourth adjusting circuits A40, each of which is connected between the fourth fulcrum Q4 and the ground (GND);

each of the plurality of fourth adjusting circuits A4 comprises:

a fourth switch tube T4, wherein a source of the fourth switch tube T4 is connected to the ground GND; and a fourth resistor R4, connected between a drain of the fourth switch tube T4 and the fourth fulcrum Q4.

In the above-mentioned technical solution, as shown in FIG. 6, the fourth adjusting module A4 comprises a plurality of fourth adjusting circuits A40, and each of the plurality of fourth adjusting circuits A40 comprises the fourth switch tube T4 and the fourth resistor R4, and the fourth switch tube T4 is a P-type MOS transistor. Voltage weights of the fourth adjusting module A4 can be adjusted by selecting different resistance values of the fourth resistor R4 through the fourth switch tube T4, so as to achieve the purpose of phase adjustment.

Furthermore, by adjusting the fourth switch tube T4 of the fourth adjusting module A4, and selecting different resistance values of the fourth resistor R4, a first clock signal and a second clock signal with the same frequency and different phases are mixed in proportion by adopting a voltage mode to generate an interpolation signal with the same frequency and the phase between the first clock signal and the second clock signal so as to achieve the purpose of phase adjustment, and meanwhile, the circuit can be carried out under lower voltage, so that the power consumption of the phase adjusting circuit is further reduced.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. A phase interpolator, comprising:
   a phase adjusting circuit comprising a first phase adjusting module and a second phase adjusting module, the first phase adjusting module outputting a first clock signal, and the second phase adjusting module outputting a second clock signal;
   the first phase adjusting module and the second phase adjusting module are connected in parallel to output an interpolation signal;
   wherein each of the first phase adjusting module and the second phase adjusting module comprises:
   a signal input end;
   a signal output end;
   a first MOS transistor, wherein a gate of the first MOS transistor is connected to the signal input end, a drain of the first MOS transistor is connected to a VCC (Volt Current Condenser), and a source of the first MOS transistor is connected to a first fulcrum;
   a first adjusting module, connected between the first fulcrum and the signal output end;

a second MOS transistor, wherein a gate of the second MOS transistor is connected to the signal input end, a source of the second MOS transistor is connected to a ground (GND), and a drain of the second MOS transistor is connected to a second fulcrum; and a second adjusting module, connected between the second fulcrum and the signal output end.

2. The phase interpolator of claim 1, wherein the phase interpolator further comprises a low-pass filter circuit, an input end of the low-pass filter circuit is connected to an output end of the phase adjusting circuit, the low-pass filter circuit is configured to filter a high-frequency signal of the interpolation signal.

3. The phase interpolator of claim 2, wherein the phase interpolator further comprises a shaping circuit, an input end of the shaping circuit is connected to an output end of the low-pass filter circuit, the shaping circuit is configured to shape the interpolation signal output by the low-pass filter circuit, so as to output a required interpolation signal.

4. The phase interpolator of claim 1, wherein the first adjusting module comprises a plurality of first adjusting circuits, each of which is connected between the first fulcrum and the signal output end.

5. The phase interpolator of claim 4, wherein each of the plurality of first adjusting circuits comprises:
   a first switch tube, wherein a drain of the first switch tube is connected to the first fulcrum; and
   a first resistor, connected between a source of the first switch tube and the signal output end.

6. The phase interpolator of claim 1, wherein the second adjusting module comprises a plurality of second adjusting circuits, each of which is connected between the second fulcrum and the signal output end.

7. The phase interpolator of claim 6, wherein each of the plurality of second adjusting circuits comprises:
   a second switch tube, wherein a source of the second switch tube is connected to the second fulcrum; and
   a second resistor, connected between a drain of the second switch tube and the signal output end.

8. The phase interpolator of claim 5, wherein both the first MOS transistor and the first switch tube are N-type MOS transistors.

9. The phase interpolator of claim 7, wherein both the second MOS transistor and the second switch tube are P-type MOS transistors.

10. The phase interpolator of claim 1, wherein each of the first phase adjusting module and the second phase adjusting module comprises:
    a third MOS transistor, wherein a gate of the third MOS transistor is connected to the signal input end, a drain of the third MOS transistor is connected to a third fulcrum, and a source of the third MOS transistor is connected to the signal output end;
    a third adjusting module, connected between the third fulcrum and a VCC;
    a fourth MOS transistor, wherein a gate of the fourth MOS transistor is connected to the signal input end, a source of the fourth MOS transistor is connected to a fourth fulcrum, and a drain of the fourth MOS transistor is connected to the signal output end; and
    a fourth adjusting module, connected between the fourth fulcrum and the ground.

11. The phase interpolator of claim 10, wherein the third adjusting module comprises a plurality of third adjusting circuits, each of which is connected between the third fulcrum and the VCC.

12. The phase interpolator of claim 11, wherein each of the plurality of third adjusting circuits comprises:
    a third switch tube, wherein a drain of the third switch tube is connected to the VCC; and
    a third resistor, connected between a source of the third switch tube and the third fulcrum.

13. The phase interpolator of claim 10, wherein the fourth adjusting module comprises a plurality of fourth adjusting circuits, each of which is connected between the fourth fulcrum and the ground.

14. The phase interpolator of claim 13, wherein each of the plurality of fourth adjusting circuits comprises:
    a fourth switch tube, wherein a source of the fourth switch tube is connected to the ground; and
    a fourth resistor, connected between a drain of the fourth switch tube and the fourth fulcrum.

15. The phase interpolator of claim 12, wherein both the third MOS transistor and the third switch tube are N-type MOS transistors.

16. The phase interpolator of claim 14, wherein both the fourth MOS transistor and the fourth switch tube are P-type MOS transistors.

* * * * *